US009503649B2

(12) United States Patent
Barrett et al.

(10) Patent No.: US 9,503,649 B2
(45) Date of Patent: Nov. 22, 2016

(54) COOPERATIVE OPTICAL-IMAGING SENSOR ARRAY (71) Applicant: UNIVERSITY OF WYOMING, Laramie, WY (US)

(72) Inventors: Steven F. Barrett, Laramie, WY (US); Michael J. Wilcox, Colorado Springs, CO (US); Donald C. Thelen, Jr., Bozeman, MT (US); David F. Cox, Tucson, AZ (US)

(73) Assignee: UNIVERSITY OF WYOMING, Laramie, WY (US)

( * ) Notice: Subject to any disclaimer, the term of this patent is extended or adjusted under 35 U.S.C. 154(b) by 0 days.

(21) Appl. No.: 13/732,012

(22) Filed: Dec. 31, 2012

(65) Prior Publication Data
US 2013/0208126 A1 Aug. 15, 2013

Related U.S. Application Data (63) Continuation of application No. 11/150,478, filed on Jun. 11, 2005, now Pat. No. 8,344,342.

(60) Provisional application No. 60/579,959, filed on Jun. 14, 2004.

(51) Int. Cl.
G01V 8/00 (2006.01)
H04N 5/232 (2006.01)
G06K 9/58 (2006.01)
G06K 9/60 (2006.01)
G06T 7/40 (2006.01)
H01L 27/146 (2006.01)

(52) U.S. Cl.
CPC ............ H04N 5/23296 (2013.01); G06K 9/58 (2013.01); G06K 9/60 (2013.01); G06T 7/403 (2013.01); G06T 2200/28 (2013.01); H01L 27/14601 (2013.01)

(58) Field of Classification Search
USPC ............................ 250/214 AL, 221, 227.11, 250/559.19–559.37, 208.1
See application file for complete search history.

(56) References Cited

U.S. PATENT DOCUMENTS 5,834,765 A * 11/1998 Ashdown ...................... 250/221

OTHER PUBLICATIONS

Wilcox, et al., "An Analog Model of Retinal Information Processing in the Eye of the Fly," 6th NASA Symposium on VLSI Design 1997, pp. 3.4.1-3.4.15.
Wilcox, et al., "A Retina with Parallel Input and Pulsed Output, Extracting High-Resolution Information," IEEE Transactions on Neural Networks, vol. 10, No. 3, May 1999, pp. 574-583.
Harman et al., "Biomimetic Machine Vision System," 42nd Annual Rocky Mountain Bioengineering Symposium 2005, Instrument Society of America, Apr. 2005, pp. 175-186.
Madsen et al., "Software Model of a Machine Vision System Based on the Common House Fly," 42nd Annual Rocky Mountain Bioengineering Symposium 2005, Instrument Society of America, Apr. 2005, pp. 335-345.
Wright et al.,"Using Parallel Evolutionary Development for a Biologically-Inspired Computer Vision System for Mobile Robots," 42nd Rocky Mountain Bioengineering Symposium 2005, Instrument Society of America, Apr. 2005, pp. 253-264.
Riley, Dylan T., "Musca Domestica Inspired Machine Vision with Hyperacuity," MSEE (Plan A), University of Wyoming, Aug. 2004, funded by NIH Cobre Grant, pp. 1-161.

* cited by examiner

Primary Examiner — Seung C Sohn
(74) Attorney, Agent, or Firm — Samuel M. Freund; Cochran Freund & Young LLC (57) ABSTRACT

An apparatus and method for providing image primitives, such as edge polarity, edge magnitude, edge orientation, and edge displacement, and derivatives thereof, for an object are described. The data are obtained substantially simultaneously and processed in parallel such that multiple objects can be distinguished from one another in real time.

6 Claims, 6 Drawing Sheets

COOPERATIVE OPTICAL-IMAGING SENSOR ARRAY

CROSS REFERENCE TO RELATED APPLICATIONS

This application is a continuation of U.S. patent application Ser. No. 11/150,478, which issued as U.S. Pat. No. 8,344,342 on Jan. 1, 2013, and claims the benefit of U.S. Provisional Patent Application No. 60/579,959 for "Biologically Inspired Analog Hyperacuity Vision System" by Steven Barrett et al. which was filed on Jun. 14, 2004, the entire contents of which being hereby incorporated by reference herein for all it discloses and teaches.

STATEMENT REGARDING FEDERAL RIGHTS

This invention was funded in part with government support under grant number N68936-01-2-2002 awarded by the Naval Air Warfare Center to Hyperacuity Systems, Inc., under Contract No. N68936-00-R-0095 awarded by the Naval Air Warfare Center, Weapons Division to the University of Wyoming, and under Grant No. P20 RRO15553 awarded by the National Institutes of Health to the University of Wyoming. The U.S. Government has certain rights in the invention.

FIELD OF THE INVENTION

The present invention relates generally to optical sensors and, more particularly, to combining the analog outputs from a plurality of photosensors adapted for viewing an object, whereby image parameters, such as edge magnitude, edge orientation, and edge polarity, as examples, can be extracted.

BACKGROUND OF THE INVENTION

Digital-based optical imaging systems generally project and capture image data on a two-dimensional array of photodetector elements, such as a charge-coupled detector. The image data is then sequentially shifted into a host processor for image information extraction one pixel at a time, and image reassembly. Often multiple layers of image processing functions are performed in sequence to extract image information.

Accordingly, it is an object of the present invention to provide an apparatus and method for parallel extraction of optical image information, without first sampling the captured image.

Another object of the invention is to provide an apparatus and method for extraction of optical image information which is insensitive to changes in lighting conditions and contrast.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the optical-imaging apparatus hereof includes: at least two optical sensors disposed in a chosen configuration such that neighboring optical sensors comprising the at least two optical sensors have overlapping fields of view, for receiving optical signals from an object at least a portion of the image of which object is located within the field of view of the at least two optical sensors, the at least two optical sensors having analog outputs; means for measuring the analog outputs of the at least two optical sensors in response to the optical signals in parallel; and means for processing the analog outputs to generate image features of the object.

In another aspect of the present invention, in accordance with its objects and purposes, the method for obtaining image features from an object hereof includes comprising the steps of: receiving optical signals from the object on at least two optical sensors having overlapping fields of view within which at least a portion of the image of the object is located, and analog outputs; measuring the analog outputs of the at least two optical sensors responsive to the optical signals in parallel; and processing the analog outputs to generate image features.

Benefits and advantages of the present invention include, but are not limited to, generating image primitives, such as edge polarity, edge magnitude, edge orientation, and edge displacement, and derivatives thereof, for an object or multiple objects in real time.

BRIEF DESCRIPTION OF THE DRAWINGS

The accompanying drawings, which are incorporated in and form a part of the specification, illustrate the embodiments of the present invention and, together with the description, serve to explain the principles of the invention.

FIGS. 2a-2c are schematic representations of the manner in which certain combinations of responses from photoreceptors in a cartridge give rise to image primitives related to an edge crossing over a cartridge of light receptors.

FIG. 5a is a schematic representation of one embodiment of the apparatus of the present invention illustrating a side view of seven ball lens optical elements disposed in a hexagonal configuration and comprising an optical sensor cartridge when connected to corresponding photodetectors through optical fibers, with associated focusing optical elements and analog electronics, while

DETAILED DESCRIPTION

Briefly, the present invention includes an apparatus and method for providing image primitives, such as edge polarity, edge magnitude, edge orientation, and edge displacement, and derivatives thereof, for an object. The data are obtained substantially simultaneously and processed in parallel such that multiple objects can be distinguished from one another in real time.

A plurality of cooperating analog photosensors or photodetectors is disposed in a chosen array thereof, hereinafter termed as a modular element or cartridge. The electrical output from each photosensor is substantially simultaneously received and processed in parallel with that from the other sensors. Each cartridge has the capability of extracting image parameters from an object within its field of view from a combination of the information from each of its constituent detector assemblies. Output signals from the detectors may be combined using analog operational amplifiers to extract image parameters such as edge magnitude, orientation, polarity, as examples, and their derivatives. The information processing performed within each sensor cartridge is substantially insensitive to changes in lighting conditions and contrast. Although the simulated performance of the sensor array of the invention has been demonstrated using overlapped, Gaussian profile sensors, the advantages of cooperative sensing may be achieved using other sensor arrays.

Each sensor cartridge performs independently of and in parallel with other cartridges within a chosen array of cartridges. This permits rapid extraction of image primitives or features in parallel. In automatic pattern recognition, a feature is a property of an image that is useful for its interpretation. For the purpose of description and illustration of the present invention, features include detection of object discontinuities. Such discontinuities may be a point source or an edge. A point source is isolated from other objects in the image and is smaller than the physical size of the detector, while an edge is a change in spatial frequency characterized by a change in intensity of detected light and is recognized by comparing the outputs from each photosensor included within a cartridge.

Detected features may be used independently of one another or may be combined for use in higher level image processing. For example, information between adjacent independent cartridges in a parallel array of cartridges may be shared to generate object segmentation. The capability to segment and track multiple moving objects using the present method and apparatus has also been demonstrated.

It is difficult to precisely quantify the speed advantage of a parallel analog based array versus a digital charge coupled device implementation, since such quantification is highly application specific. A parallel array of analog sensor cartridges would simultaneously calculate image primitives using several stages of standard operational amplifiers. If 10 stages were required for each cartridge, and the settling time of each operational amplifier is 0.5 µs, an image primitive could be generated in approximately 5.0 µs. In digital based implementations, image data is captured on a two-dimensional array of photo-elements, and sequentially shifted to a host processor for image primitive extraction one pixel at a time. The two-dimensional array is reassembled in the host processor. Image primitive extraction is then performed across the image a pixel location at a time.

Figure 1:
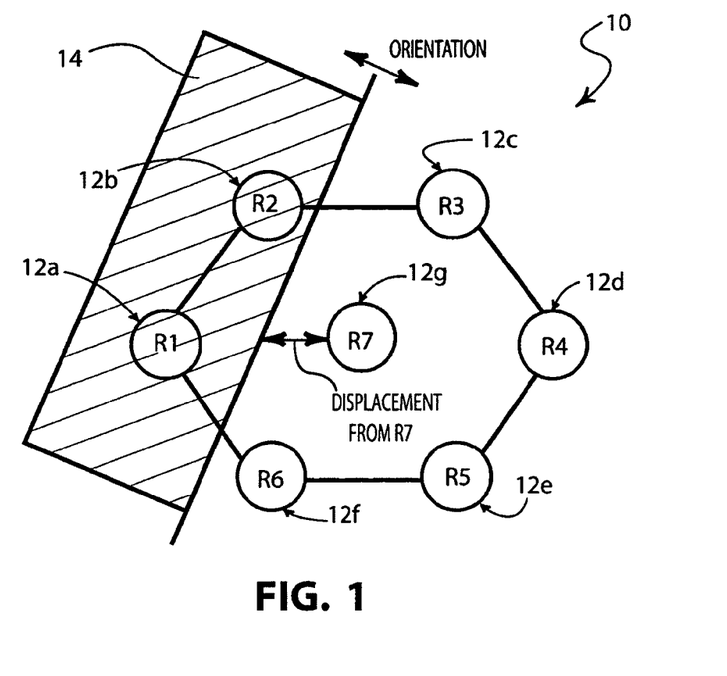
FIG. 1 is a schematic representation of an edge blocking light reaching certain of the light receptors in a modular element or cartridge thereof.

Reference will now be made in detail to the present preferred embodiments of the invention, examples of which are illustrated in the accompanying drawings. In what follows, similar or identical structure is labeled using identical callouts. Turning now to the drawings, FIG. 1 is schematic representation of hexagonal-shaped array, 10, of photoreceptors, 12a-12f (R1-R6), respectively, surrounding center reference sensor, 12g (R7). Each sensor is assumed to have an arbitrary receptive area. Clearly, top-hat, mesa or other array geometries can be employed with the choice of orientation and spacing of the photoreceptors being dependent on the specific application intended. By use of appropriate electronic circuitry, to be described hereinbelow, each of the sensors can share information with adjacent sensors within the cartridge to extract image features. The spacing between independent sensors and their individual receptive areas may be optimized for specific applications. Only the central area of each sensor is shown for simplicity; however, in what follows it is assumed that each sensor has a Gaussian far-field receptive profile that overlaps with adjacent sensors. Each sensor also has a single output, a voltage that corresponds to the amount of illumination the sensor receives. If the sensor is in darkness, its output will be zero volts. If the sensor is fully and evenly illuminated it will have an output proportional to the luminance. If edge, 14, blocks the light reaching a photosensor (for example R2), its output voltage will be some value between zero and the maximum output corresponding to where the edge falls within the sensor field of view, and two intensity levels are associated with the edge and the weighting of the Gaussian profile.

One property of an image that is useful for its interpretation is a change in continuity. The photosensor cartridge of the present invention uses a comparative approach to detect such discontinuities. That is, discontinuities are detected by comparing the six photosensor 12a-12f outputs. As stated hereinabove, both edges and point sources are characterized by high and low spatial frequencies located within a cartridge, with the point source and edge properties being smaller than the physical size of a single photodetector. Cooperative processing of such features allows location of the edge with higher resolution than the spacing of individual photodetectors. That is, when the effects of a point source or an edge characterized by high spatial frequency components input to an individual photoreceptor are compared to the outputs of neighboring photoreceptors in the same cartridge, a one-dimensional location of that point source or edge feature is obtained. Two independent, but coupled photoreceptors reporting the presence of the same point source or edge feature whether they have overlapping or independent fields of view removes the directional ambiguity for the exact location of the feature. Three, linearly arrange photoreceptors reporting the same feature further reduces the positional ambiguity, and six photoreceptors provide displacement and direction on a two-dimensional detector array with subpixel resolution.

Edge detection will be used to illustrate the apparatus and method of the present invention. For cartridge 10, the result of an edge blocking the light impinging on a portion of the hexagonal array of light receptors will be seven individual analog voltages, one from each of the receptors 12a-12g (R1 to R7). The voltages from each of these receptors may be combined using mathematical operations (which can be implemented with simple known operational amplifier configurations) to extract image features that describe the edge. In the optical system described, it is assumed that each cartridge (array of seven photodetectors) is independent of all other cartridges in an array of cartridges. Therefore, each cartridge can calculate its image features essentially simultaneously (in parallel) with all the other cartridges within the array. Information that may be extracted from an individual cartridge includes: edge polarity (indicates which half of the cartridge is most illuminated); edge magnitude (measures the intensity difference between Illuminated and non-illuminated portions of the cartridge); edge orientation (indicates angular displacement from a major axis); edge displacement from photoreceptor 12g (R7) (measures the edge displacement from the center of the cartridge). Additionally, higher-order functions, such as temporal derivatives of each edge parameter, edge maps, segmentation, center of mass, and object direction may be obtained.

Figure 2A:
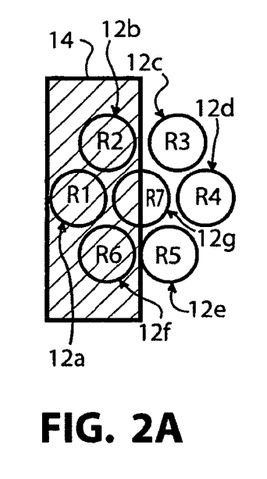
FIG. 2a illustrates the determination of the edge magnitude.
Figure 2B:
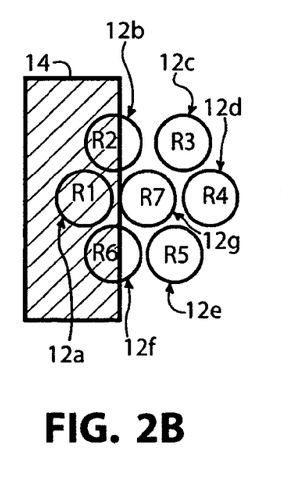
FIG. 2b illustrates the determination of the edge displacement from the center photoreceptor.
Figure 2C:
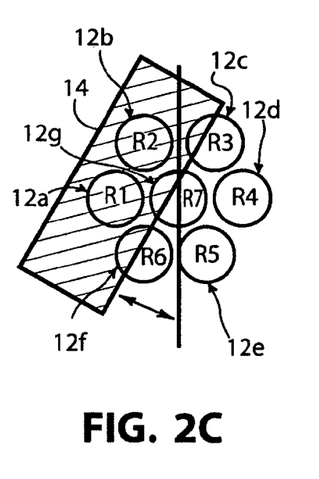
FIG. 2c illustrates the determination of edge orientation.

FIGS. 2a-2c are schematic representations of the manner in which certain combinations of responses from photoreceptors in a cartridge give rise to image primitives related to an edge crossing a cartridge of light receptors: FIG. 2a illustrates the determination of the edge magnitude; FIG. 2b illustrates the determination of the edge displacement from the center photoreceptor; and FIG. 2c illustrates the determination of edge orientation. Each feature is extracted from combination of photosensor data.

Figure 3:
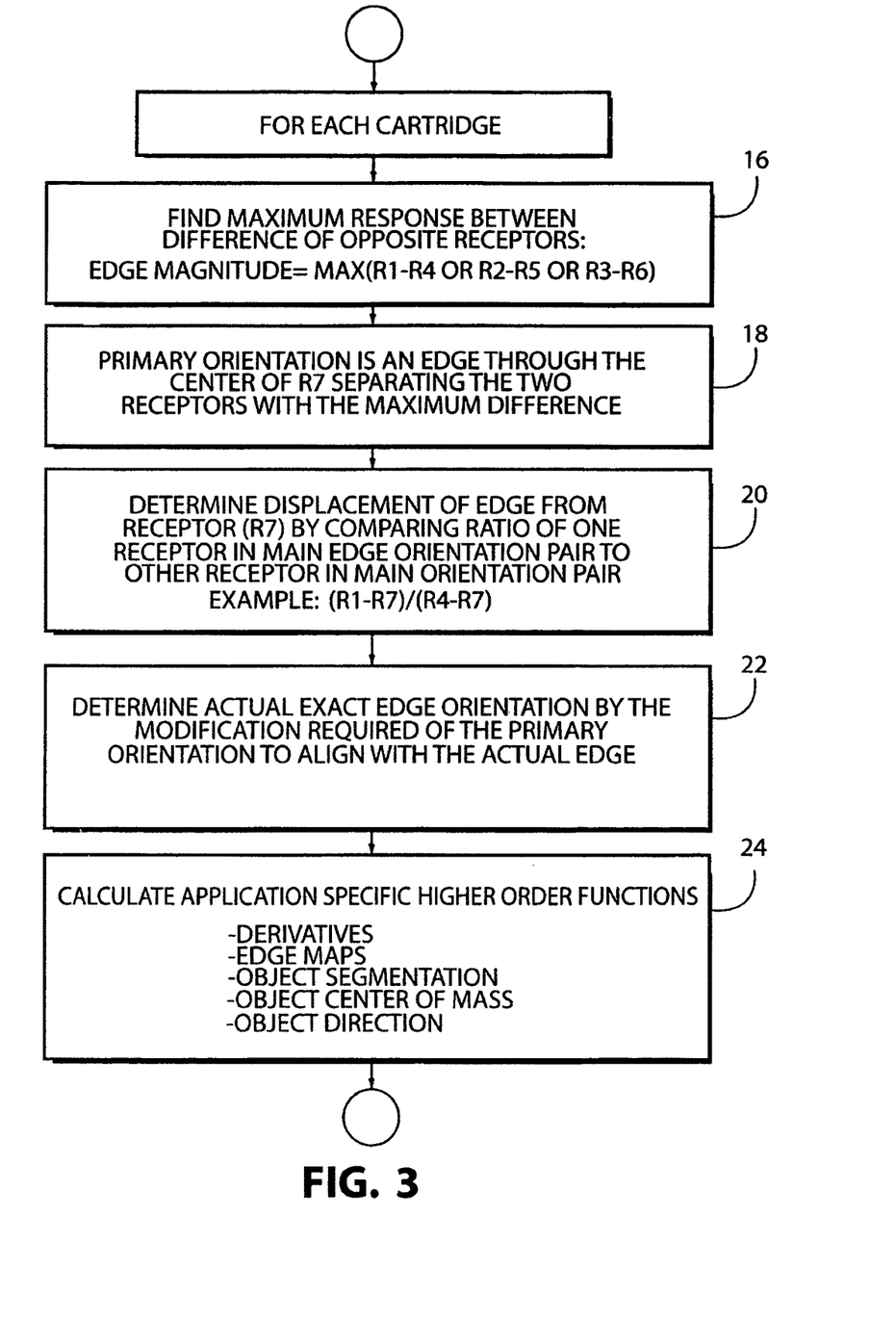
FIG. 3 is a flow chart setting forth a method in accordance with the teachings of the present invention for calculating the image primitives: edge magnitude; primary edge orientation; edge displacement from the center receptor; and exact edge orientation.

FIG. 3 shows the sequential determination of image features in accordance with the teachings of the present invention. However, all features may be calculated simultaneously using additional analog hardware. It should be pointed out that the data for these feature determinations would have been collected substantially simultaneously (in parallel).

(a) Edge magnitude, 16, is determined from the maximum response of the difference of opposite receptors in the array (FIG. 2a). Individual receptor values are analog voltages from each receptor. The difference operator and the maximum operator are standard operational amplifier configurations. Thus, edge magnitude is given by the maximum of (R1−R4, R2−R5, R3−R6).

(b) Primary orientation, 18, may be determined when the maximum is chosen in the calculation of edge magnitude 16. The primary orientation is when the edge passing through the center of receptor 12g (R7) that separates the two receptors has the maximum edge magnitude. This is an intermediate feature used to select which receptors pairs should be used in subsequent calculations.

(c) Displacement of the edge from center receptor R7, 20, is determined by comparing the ratio of one receptor in the primary edge orientation pair to the other receptor in the primary orientation pair. For example, in FIG. 2b, the maximum difference in edge magnitude would be between R1 and R4. Therefore, these two receptor outputs along with R7 are used to determine the displacement from R7 as (R1−R7)/(R4−R7). This calculation may readily be implemented using standard analog operational amplifier difference and division operators. As will be described hereinbelow, this image feature is insensitive to changes in illumination and changes in edge magnitude.

(d) Exact orientation, 22, takes into account that the actual edge may be displaced from the primary orientation. To determine this feature the photoreceptors adjacent to one of the receptors used to determine the main orientation is used. For example, in FIG. 2c, orientation= [(R1−R4)/rms, (R2−R5)/rms, (R3−R6)/rms], where rms is the root mean square of the six peripheral photoreceptors. This calculation is readily implemented using standard analog operational amplifier difference and division operators. This image feature is also insensitive to changes in illumination and changes in edge magnitude.

(e) To calculate a specific higher order functions, 24, image features provided by the array of cartridges are combined in specific ways for each feature:
  i. feature derivatives: the time derivative of each feature is computed using standard operational amplifier derivative configurations.
  ii. edge maps: edge maps may be constructed by cooperatively linking cartridges having similar information. For example, if two cartridges report the same edge parameters an edge link may be established between them.
  iii. object segmentation and direction: object segmentation is achieved for multiple moving objects by grouping the cartridges reporting similar derivative data as having their origin from the same object. This information may also be used to determine object direction.
  iv. center of mass: once an object is segmented, the center of mass of the object may be calculated using known techniques. The present invention has the capability to quickly provide the data required by the center of mass circuitry.

Other features may also be extracted from the array based on the specific requirements of an application. The equations shown to extract the features may be implemented in software, analog hardware, digital hardware, or some combination of these methods.

Figure 4:
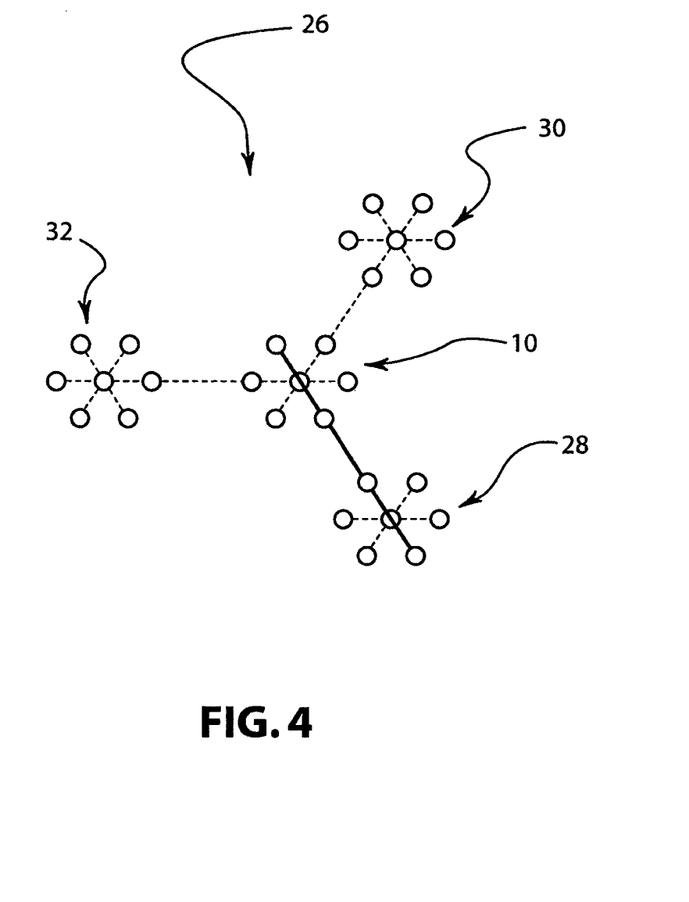
FIG. 4 is a schematic representation of a plurality of seven-member cartridges, two of which are imaging the same object.

The information from each sensor is a continuous stream of data related to the object's orientation in relationship to the array and also its movement dynamics. If an object moves in relation to the array, the sensors corresponding to the object will register a change in signal output (a derivative signal). All sensors reporting the same change in information are related to the same object and object segmentation may be achieved as a result. Moreover, derivative information can be used to determine object velocity. FIG. 4 is a schematic representation of an array of cartridges, 26, illustrating member cartridge 10 comparing edge parameters with its immediate neighbors, 28, 30, and 32. If a neighbor or neighbors is found to have similar edge parameters, an adjoining edge is established between the cartridges.

Figure 5A:
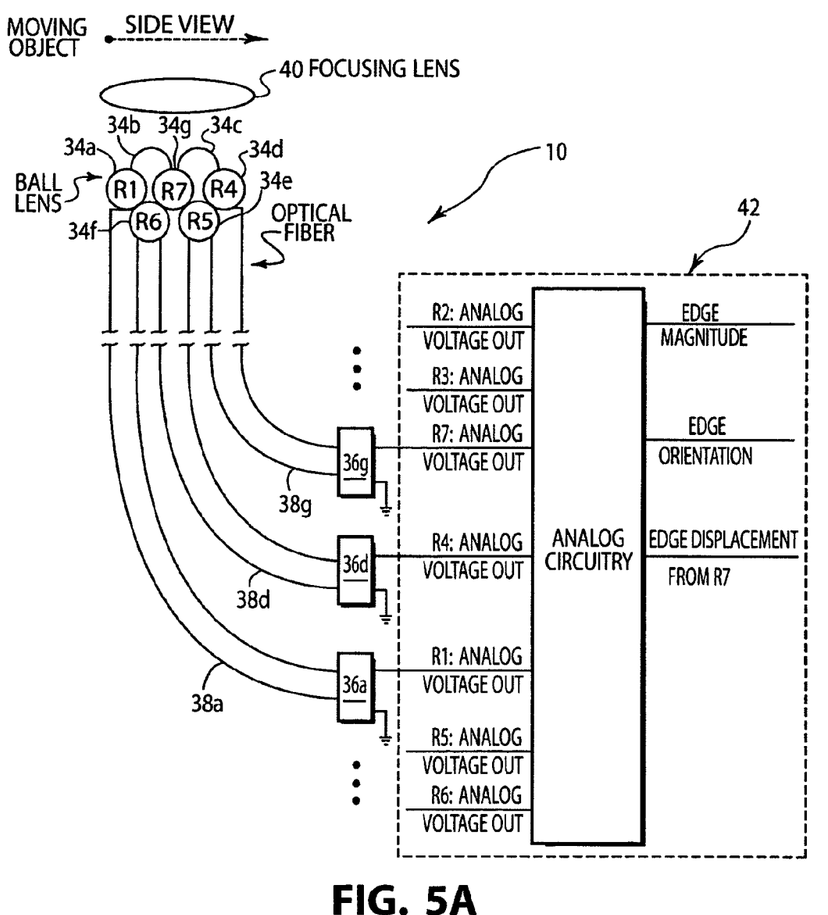
Figure 5B:
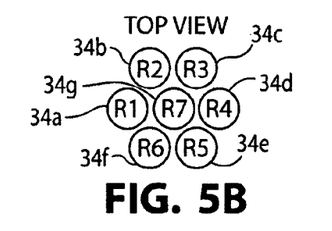
FIG. 5b is a schematic representation of a top view of the ball lenses.

FIG. 5a is a schematic representation of one embodiment of the seven photoreceptor cartridge apparatus 10 of the present invention illustrating a side view of seven ball lens optical elements, 34a-34g, disposed in a hexagonal configuration and comprising a photosensor cartridge, when connected to photodetectors, 36a, 36d, and 36g, (the remaining four photodetectors not being illustrated, using optical fibers, 38a, 38d, and 38g (the remaining four optical fibers not being illustrated), with associated focusing optical element, 40, and analog electronics, 42. FIG. 5b is a schematic representation of a top view of the ball lenses. Ball lenses generate a Gaussian far-field image of an object within their field of view.

Figure 6:
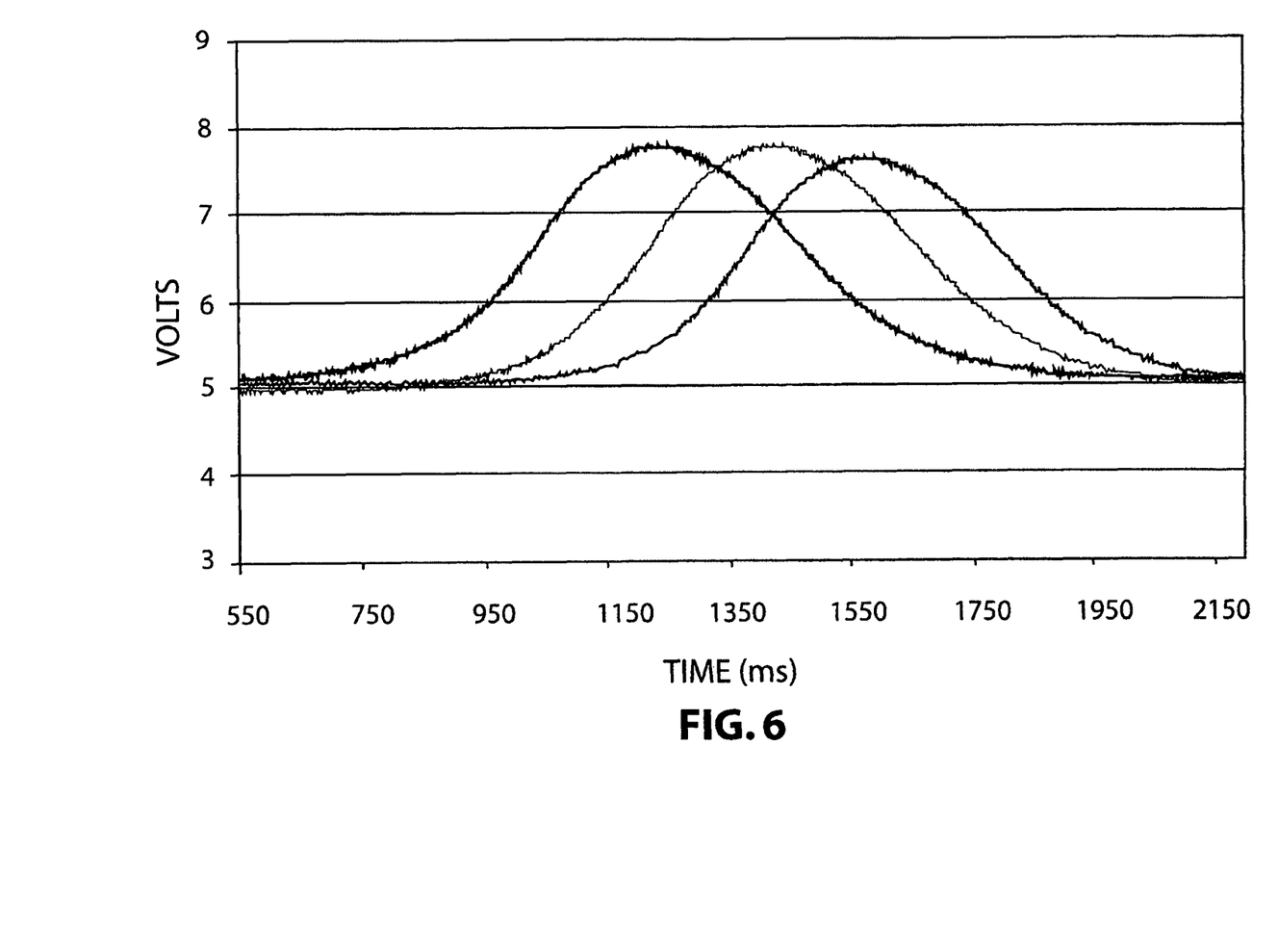
FIG. 6 is an oscilloscope trace of the voltage obtained from receptors R1, R4, and R7 illustrated in FIG. 4 hereof, when a thin edge is passed in front of the detector array from R1 (left) to R4 (right), as described in FIG. 5b hereof, showing overlapping Gaussian profiles of the individual photoreceptor responses, which would then be processed using additional analog circuitry to extract edge features.

FIG. 6 is an oscilloscope trace of the voltage obtained from receptors R1, R4, and R7 illustrated in FIG. 5a hereof, when a thin edge is passed in front of the detector array from R1 (left) to R4 (right), showing overlapping Gaussian profiles of the individual photoreceptor responses, which would then be processed using additional analog circuitry to extract edge features.

Figure 7:
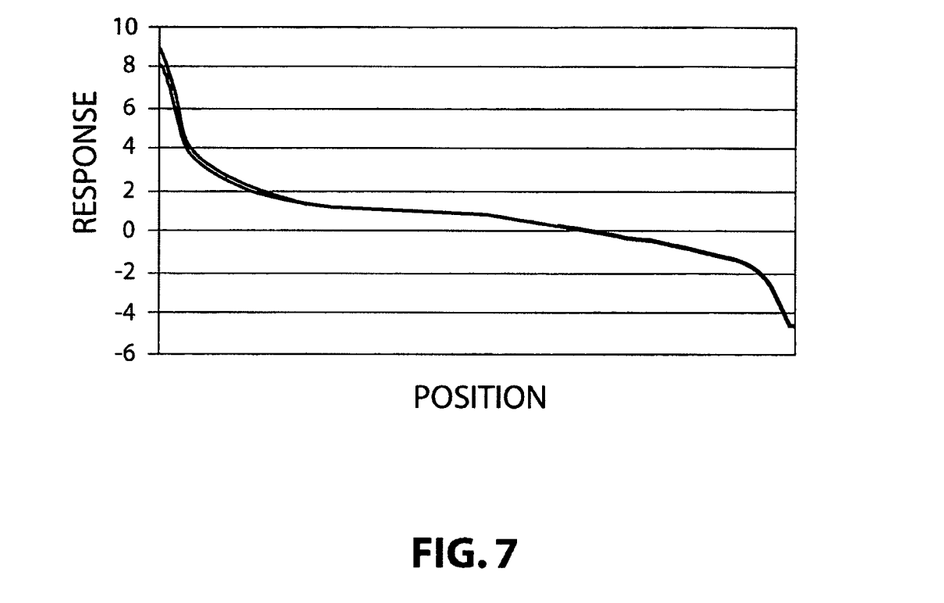
FIG. 7 is a graph illustrating that by use of ratios of photoreceptor responses, the extraction of image primitives (for example, the extraction of the displacement of an edge from R7, where two edges are swept across a one-dimensional array of three overlapping Gaussian profile photoreceptors in independent sweeps) is insensitive to changes in lighting conditions and also to changes in the magnitude of an edge impinging on a cartridge.

FIG. 7 is a graph illustrating that by use of ratios of photoreceptor responses, the extraction of image primitives (for example, the extraction of the displacement of an edge from R7, where two edges were swept across a one-dimensional array of three overlapping Gaussian profile photoreceptors in independent sweeps) is insensitive to changes in lighting conditions, and also to changes in the magnitude of an edge blocking light impinging on a cartridge. This desirable characteristic allows for the extraction of reproducible, unique edge features regardless of edge magnitude. Furthermore, it allows for the extraction of higher-order image processing functions. As stated, the insensitivity is achieved by using ratios between photoreceptor responses. For example, the equation to extract the displacement from R7 (displacement=(R7−R1)/(R4−R7)) was tested using six different edge magnitude conditions. As seen in FIG. 7, the resulting plots overlap and are indistinguishable from one another. Furthermore, the data generated by these equations to generate the plots were essentially identical. In one sweep an edge had a magnitude of 100 (200 light, 100 dark) while the other sweep had an edge magnitude of 200 (250 light, 50 dark). These results were also verified in the laboratory using actual Gaussian profile photoreceptors and analog operational amplifier circuitry to implement the equation. Again, essentially indistinguishable characteristics were obtained.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for obtaining image features from an object illuminate solely by ambient light, comprising the steps of:
   receiving optical signals from the object on at least two optical sensors having overlapping fields of view within which at least a portion of the object is located, and from which analog outputs are generated;
   simultaneously receiving the analog outputs from the at least two optical sensors responsive to the optical signals; and
   generating image features from parallel analog outputs.

2. The method of claim 1, further comprising the step of processing the analog outputs to generate image features using at least one operational amplifier.

3. The method of claim 1, wherein the image features comprise edge magnitude, primary orientation, displacement from one of the at least two optical sensors, exact orientation, and time derivative.

4. The method of claim 3, wherein the displacement from one of the at least two optical sensors and the exact orientation image features are substantially insensitive to changes in the amount of light impinging on the at least two optical sensors.

5. The method of claim 1, wherein the at least two optical sensors comprises seven optical sensors, and wherein a spatial configuration of the seven optical sensors comprises a substantially planar hexagon having a center with one optical sensor being disposed at the center, and each of the remaining six optical sensors being disposed at a vertex of the hexagon.

6. The method of claim 1, further comprising the steps of:
   receiving optical signals from the object on a plurality of sets of at least two optical sensors having a second chosen spatial configuration, the at least two optical sensors of each of the plurality of sets having overlapping fields of view within which at least a portion of the image of the object is located, and analog outputs;
   simultaneously receiving the analog outputs from the at least two optical sensors responsive to the optical signals in each of the plurality of sets; and
   generating image features from parallel analog outputs from parallel analog outputs from each set such that object segmentation and object direction can be determined.

* * * * *